(12) United States Patent
Bacon

(10) Patent No.: US 9,681,388 B2
(45) Date of Patent: Jun. 13, 2017

(54) SYSTEMS AND METHODS FOR LOW POWER RF DATA RECEPTION

(71) Applicant: COX COMMUNICATIONS, INC., Atlanta, GA (US)

(72) Inventor: Kinney Chapman Bacon, Lawrenceville, GA (US)

(73) Assignee: Cox Communications, Inc., Atlanta, GA (US)

(*) Notice: Subject to any disclaimer, the term of this patent is extended or adjusted under 35 U.S.C. 154(b) by 0 days.

(21) Appl. No.: 14/933,929

(22) Filed: Nov. 5, 2015

(65) Prior Publication Data

US 2017/0135044 A1   May 11, 2017

(51) Int. Cl.
*H04W 52/02* (2009.01)
*H04B 1/10* (2006.01)
*H04L 27/06* (2006.01)

(52) U.S. Cl.
CPC ...... *H04W 52/0261* (2013.01); *H04B 1/1036* (2013.01); *H04L 27/06* (2013.01); *H04B 2001/1063* (2013.01)

(58) Field of Classification Search
CPC ................. H04W 52/0229; H04W 52/0238
USPC ......... 455/142, 139, 131, 74, 93, 108, 236.1
See application file for complete search history.

(56) References Cited

U.S. PATENT DOCUMENTS

| | | | | |
|---|---|---|---|---|
| 6,434,194 B1* | 8/2002 | Eisenberg | .............. | H04B 1/406 375/238 |
| 6,791,489 B1* | 9/2004 | Richardson | ........... | G01S 13/765 342/159 |
| 2005/0285688 A1* | 12/2005 | Hirano | ................. | H03C 3/0925 331/16 |
| 2013/0095780 A1* | 4/2013 | Prazan | ................. | H04B 1/1615 455/234.1 |

* cited by examiner

*Primary Examiner* — John J Lee
(74) *Attorney, Agent, or Firm* — Benjamin A. Balser; Next IP Law Group

(57) ABSTRACT

Systems and methods are disclosed for low power RF communications, comprising receiving an AM signal using a passive RF receiver circuit, converting the AM signal to a digital output signal using a comparator, receiving the digital output signal from the comparator, determining whether the digital output signal is valid or not using a digital signal processing circuit, and upon detection of a valid digital output signal, enabling an active RF receiver circuit for RF signal processing.

20 Claims, 4 Drawing Sheets

SYSTEMS AND METHODS FOR LOW POWER RF DATA RECEPTION

TECHNICAL FIELD

The present disclosure is generally related to communications and, more particularly, is related to low power RF data reception.

BACKGROUND

Generally, most portable radio frequency (RF) devices such as stereo remotes and cordless telephones are battery operated. As many users of portable RF devices may appreciate, portable is often synonymous with lost and/or misplaced. Some wireless devices include a locate/page feature, whereby the misplaced device will flash and/or emit an alarm sound in response to a signal from a base station or charging dock. Unfortunately, the locate/page feature will not work if the misplaced device has run out of battery power.

One reason battery powered devices run out of power can be attributed to the fact that many battery powered devices utilize active reception of RF signals. A drawback to this approach is that active reception of RF signals presents a relatively high power drain to the battery powering the device. To compound the matter, the aforementioned relatively high power drain is also relatively constant, thereby depleting battery power even faster. There are heretofore unaddressed needs with previous low power RF solutions.

SUMMARY

Example embodiments of the present disclosure provide a method for providing RF data reception. One embodiment of such a method, among others, can be broadly summarized as receiving an amplitude modulated (AM) signal using a passive RF receiver circuit, converting the AM signal to a digital output signal using a comparator, determining whether the digital output signal is valid or not using a digital signal processing circuit, and upon detection of a valid digital output signal, enabling an active RF receiver circuit for further RF signal processing.

Embodiments of the present disclosure can also be viewed as providing systems for supporting provision of RF data reception. Briefly described, in architecture, one example embodiment of the system, among others, can be implemented as follows: a passive receiver configured to receive an AM signal using a passive RF receiver circuit, a comparator configured to convert the AM signal to a digital output signal, and a processor comprising a computer-readable medium with a set of instructions operable to receive the digital output signal from the comparator, determine whether the digital output signal is valid or not using a digital signal processing circuit, and upon detection of a valid digital output signal, enable an active RF receiver circuit for further RF signal processing.

According to still yet another embodiment of the present disclosure, example embodiments of the present disclosure for supporting provision of RF data reception include a passive RF receiver circuit for receiving an AM signal, a comparator for converting the AM signal to a digital output signal, a digital signal processing circuit for determining whether the digital output signal is valid or not, and a switch for activating an active RF receiver circuit for further RF signal processing upon detection of a valid digital output signal.

DETAILED DESCRIPTION

Figure 1:
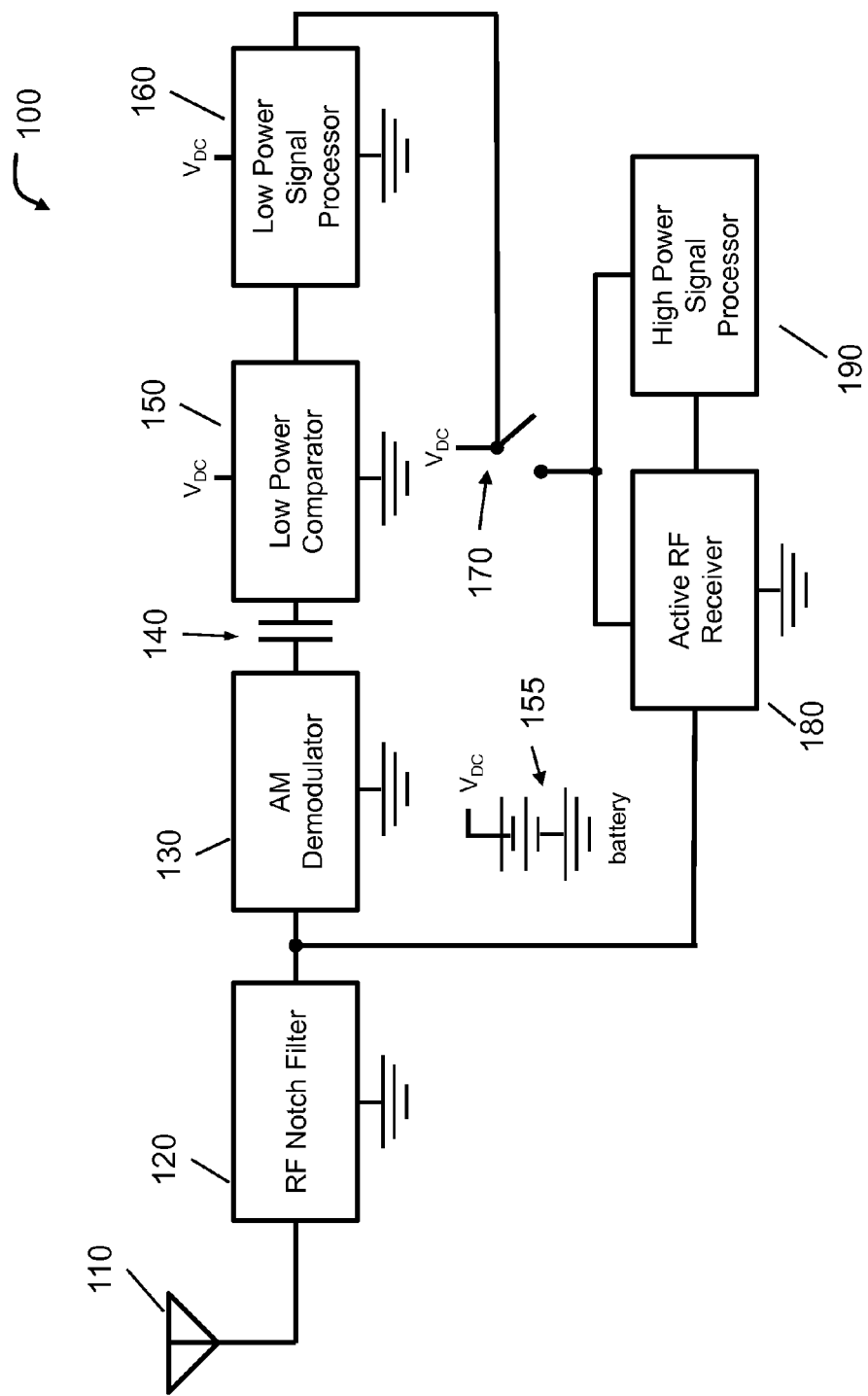
FIG. 1 provides a system block diagram of an example embodiment of a system for supporting provision of low power RF data reception.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In the following description, numerous details are set forth to provide an understanding of the present disclosure. However, it will be understood by those of ordinary skill in the art that the present disclosure may be practiced without these details and that numerous variations or modifications from the described embodiments may be possible. The disclosure will now be described with reference to the figures, in which like reference numerals refer to like, but not necessarily the same or identical, elements throughout. For purposes of clarity in illustrating the characteristics of the present disclosure, proportional relationships of the elements have not necessarily been maintained in the figures.

Referring now to the drawings in which like numerals represent like elements or steps throughout the several views, FIG. 1 provides a system block diagram of an example embodiment of a system for supporting provision of low power RF data reception via receiver 100. Receiver 100 includes antenna 110, RF notch filter 120, AM demodulator 130, AC coupler 140, low power comparator 150 and low power signal processor 160.

Antenna 110, RF notch filter 120, AM demodulator 130, and AC coupler 140 comprise a passive RF receiver circuit that does not utilize any DC/battery power. According to some non-limiting example embodiments, antenna 110 may include a coil antenna, crystal receiver, or other sensitive device. RF notch filter 120 may include one or more resistors, capacitors, and inductors. AM demodulator 130 may include one or more diodes, capacitors, and resistors. AC coupler 140 may connect the passive RF receiver circuit to comparator 150 and signal processor 160. Comparator 150 and digital signal processor 160 may utilize DC power from battery 155.

In operation, an AM signal is received over antenna 110 and passed through RF notch filter 120. The signal passes through RF notch filter 120, is demodulated via AM demodulator 130, and then passed to comparator 150 to convert the signal to a digital format. The output of comparator 150 is then passed to digital signal processor 160. It should be noted that digital signal processor 160 may utilize one or more encryption techniques in order to determine if the signal is valid or not. In an example embodiment, the signal is coded with an algorithm to reduce the likelihood of being triggered by random or non-random noise such as use of a rotating Cyclic Redundancy Code (CRC) with a random number that is not repeated.

Signal processor 160 (which, in an example embodiment is a low power signal processor) is connected, via switch 170, to active RF receiver 180 and signal processor 190 (which, in an example embodiment is a relatively higher power signal processor). When a valid signal is detected, signal processor 160 activates active RF receiver 190 via switch 170. Once toggled, switch 170 activates high level signal detection under certain conditions by providing power to active RF receiver 180 and signal processor 190. Active RF receiver 180 then receives the RF signal using one or more RF processing techniques. It will be appreciated that active RF receiver 180 may utilize a range of modulation techniques. Once the signal is detected as valid, a requested process may be executed (e.g. for a lost remote control, to sound a beep). Additionally, it will be appreciated that in some embodiments certain coding techniques are employed to minimize false activation of the active RF circuitry.

It will be appreciated that receiver 100 may provide RF reception for any number of portable devices including but not limited a computer, remote control, cordless telephone, smart phone, wireless lock, DVR and the like. Active RF receiver 180 may include one or more circuit types including heterodyne, super heterodyne and the like. Additionally, active RF receiver 180 may employ one or more techniques including automatic gain control, squelch, or other sophisticated modulation techniques.

Figure 2:
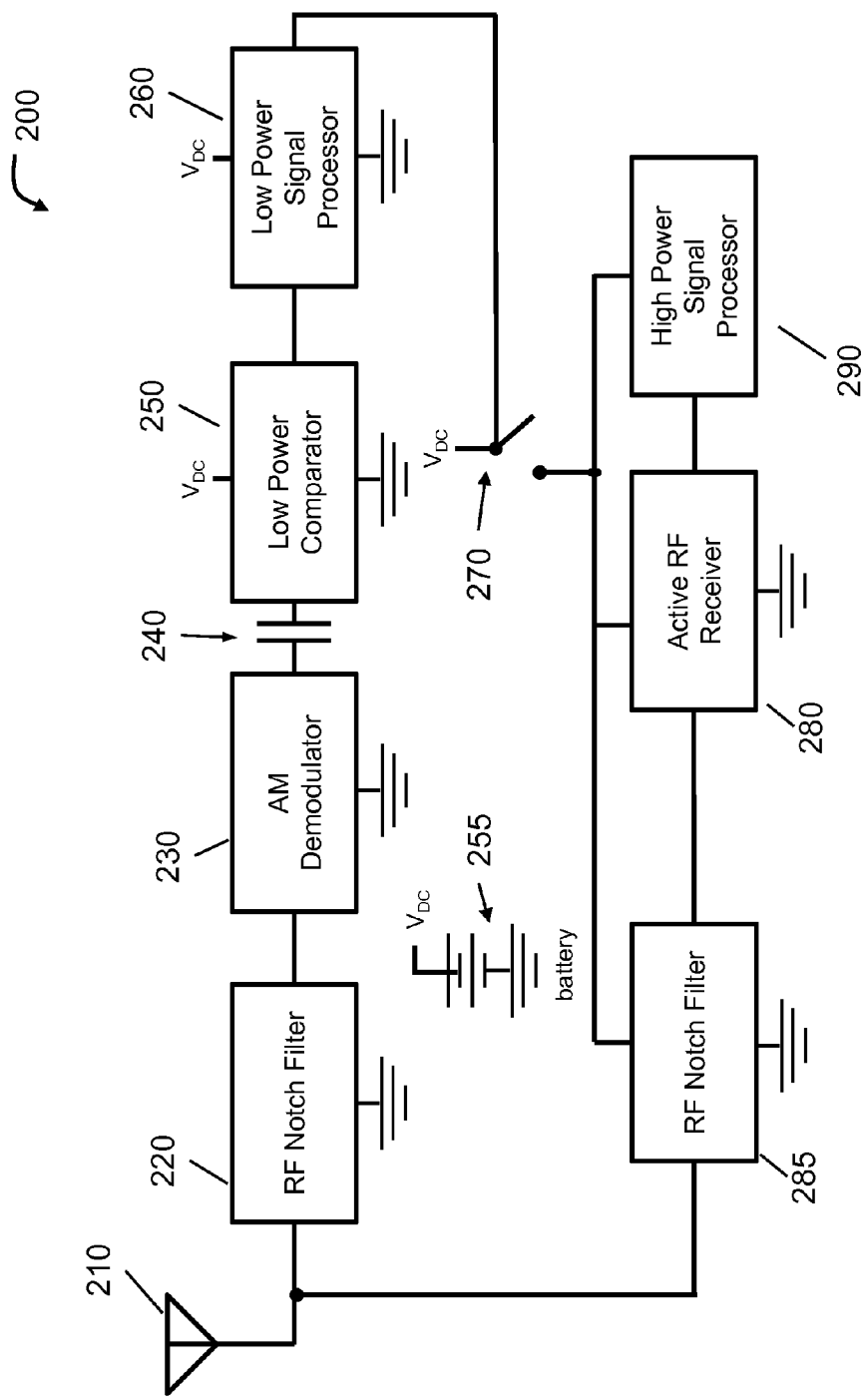
FIG. 2 provides a system block diagram of another example embodiment of a system for supporting provision of low power RF data reception.

FIG. 2 provides a system block diagram of another example embodiment of a system for supporting provision of low power RF data reception via receiver 200 according to an example embodiment of the disclosure. Receiver 200 includes antenna 210, RF notch filter 220, AM demodulator 230, AC coupler 240, comparator 250 and signal processor 260. As with FIG. 1, antenna 210, RF notch filter 220, AM demodulator 230, and AC coupler 240 comprise a passive RF receiver circuit that does not utilize any DC/battery power.

Signal processor 260 (which, in an example embodiment is a low power signal processor) is connected, via switch 270, to active RF receiver 280 and signal processor 290 (which, in an example embodiment is a relatively higher power signal processor). When a valid signal is detected, signal processor 260 activates active RF receiver 280 via switch 270. Once toggled, switch 170 activates high level signal detection under certain conditions by providing power to active RF receiver 280 and high power signal processor 290. Active RF receiver 280 then receives the RF signal using one or more RF processing techniques over antenna 210 via RF notch filter 285. It will be appreciated that while RF notch filter 285 is depicted as a separate component, in an example embodiment in accordance with the present disclosure, active RF receiver 280 circuit may include a filter, such as a notch filter, internally. RF notch filter 285 may be an active filter utilizing the same DC power as active RF receiver 280.

An alternative embodiment of the reception by the passive receiver of antenna 210, RF notch filter 220, AM demodulator 230, AC coupler 240, comparator 250 and signal processor 260 involves two stages. In a first stage, a simple RF message is received that "wakes up" the device. In a second stage, a higher level RF message is received, the higher level RF message containing more information, such as a non-limiting example of configuration information. The two message may be transmitted on the same frequency or on different frequencies. In an example embodiment, the two stages utilize different modulation methods.

The software instructions processed on signal processor 280 and signal processor 290 may be stored on a computer readable medium. As used herein, the term "computer-readable medium" may describe any form of memory or a propagated signal transmission medium. Propagated signals representing data and computer program instructions may be transferred between network devices and systems. Embodiments of computer-readable media include, but are not limited to, electronic, flash, optical, magnetic, or other storage or transmission devices capable of providing a processor with computer-readable instructions. Also, various other forms of computer-readable media may transmit or carry instructions to a computer, including a router, private or public network, or other transmission device or channel, both wired and wireless. The instructions may comprise code from any computer-programming language, including, for example, C, C++, C#, Visual Basic, Java, Python, Perl, and JavaScript.

Example environment 100 shown in and described with respect to FIGS. 1 and 2 is provided by way of example only. Numerous other operating environments, system architectures, and device configurations are possible. Other system embodiments can include fewer or greater numbers of components and may incorporate some or all of the functionality described with respect to the system components shown in FIGS. 1 and 2.

Figure 3:
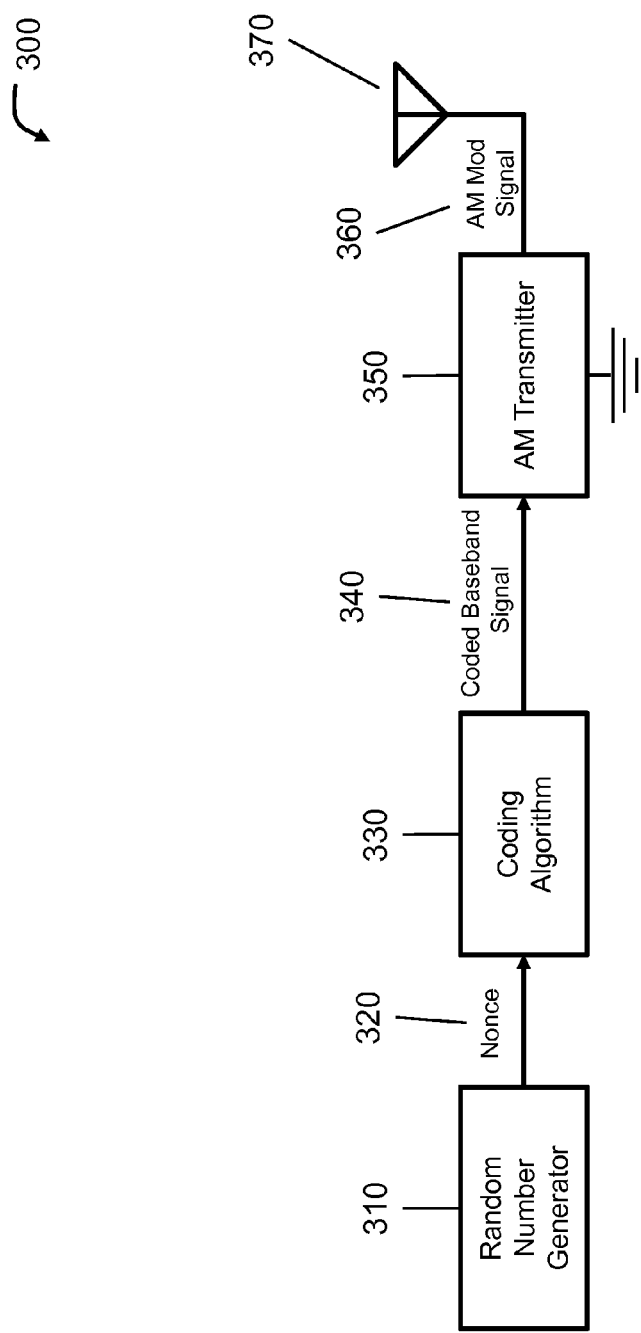
FIG. 3 provides a diagram of an example embodiment of a transmitter for supporting provision of RF data transmission.

FIG. 3 provides a diagram of an example embodiment of transmitter 300 for supporting provision of RF data transmission. As shown in FIG. 3, transmitter 300 comprises random number generator 310, which generates nonce 320 (single use random number). In an example embodiment, random number generator 310 is a pseudo random number generator. Nonce 320 is encoded into baseband signal 340 by coding algorithm module 300. Baseband signal 340 is sent to AM transmitter 350, which produces AM modulated signal 360. AM modulated signal 360 is broadcast via antenna 370 for RF reception by any number of RF devices including receivers 100 and/or 200. In an example embodiment one or more encryption techniques may be used in coding algorithm module 330. For example, according to an example embodiment, coding algorithm module 330 produces encrypted baseband signal 340 to include nonce 320 followed by one or more values, where the values are known to both transmitter 300 and receiver(s) 100, 200.

Figure 4:
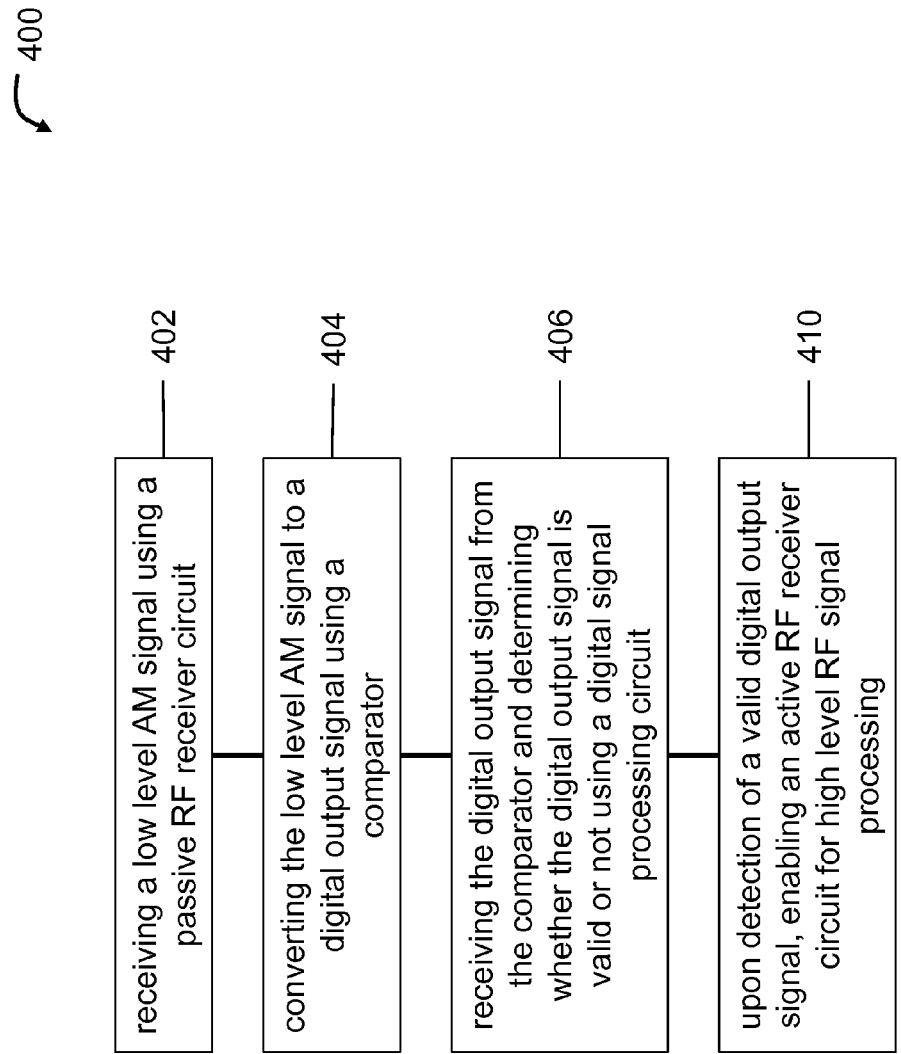
FIG. 4 provides a flow diagram of an example embodiment of a method for providing low power RF data reception.

FIG. 4 provides a flow diagram of an example embodiment of a method for providing low power RF data reception in accordance with an example embodiment of the disclosure. In block 402, a low level AM signal is received using a passive RF receiver circuit. In block 404, the AM signal is converted to a digital output signal using a comparator is shown. In block 406, the instruction to receive the digital output signal from the comparator and the digital output signal is determined as valid or not using a digital signal processing circuit. In block 408, upon detection of a valid digital output signal, an active RF receiver circuit is enabled for high level RF signal processing.

The flow diagram of FIG. 4 shows the architecture, functionality, and operation of a possible implementation of low power RF data reception. In this regard, each block represents a module, segment, or portion of code, which comprises one or more executable instructions for implementing the specified logical function(s). It should also be noted that in some alternative implementations, the functions noted in the blocks may occur out of the order noted in FIG. 4. For example, two blocks shown in succession in FIG. 4 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

Any process descriptions or blocks in flow charts should be understood as representing modules, segments, or excerpts of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present disclosure has been described in detail, it should be understood that various changes, substitutions and alterations can be made thereto without departing from the spirit and scope of the disclosure as defined by the appended claims.

Therefore, at least the following is claimed:

1. A method of receiving radio frequency (RF) communications, comprising:
   receiving an amplitude modulated (AM) signal using a passive RF receiver circuit;
   converting the AM signal to a digital output signal using a comparator;
   determining whether the digital output signal is valid or not using a digital signal processing circuit to determine if the digital output signal includes a nonce followed by a known value; and
   upon detection of a valid digital output signal, enabling an active RF receiver circuit for RF signal processing.

2. The method of claim 1 wherein the passive RF receiver circuit comprises an antenna, a notch filter, and an AM demodulator device.

3. The method of claim 1, wherein the comparator is AC coupled to the passive RF receiver circuit.

4. The method of claim 1, wherein determining whether the digital output signal is valid or not uses one or more coding techniques.

5. The method of claim 1, wherein determining whether the digital output signal is valid or not is based at least in part on determining if the digital output signal includes a nonce followed by a known value.

6. The method of claim 1, wherein enabling an active RF receiver circuit for RF signal processing further includes using active signal modulation techniques.

7. The method of claim 1, wherein enabling an active RF receiver circuit for RF signal processing further includes executing a process in accordance with a signal received by the active RF receiver circuit.

8. A system for reception of RF communications, comprising:
   a passive RF circuit configured to receive an AM signal;
   a comparator configured to convert the AM signal to a digital output signal; and a processor comprising a non-tangible computer readable medium with a set of instructions operable to:
receive the digital output signal from the comparator;
determine whether the digital output signal is valid based on a determination of whether the digital output signal includes a nonce followed by a known value; and
upon detection of a valid digital output signal, enable an active RF receiver circuit for RF signal processing.

9. The system of claim 8 wherein the passive RF receiver circuit comprises an antenna, a notch filter, and an AM demodulator.

10. The system of claim 8, wherein the comparator is AC coupled to the passive RF receiver circuit.

11. The system of claim 8, wherein the instruction to determine whether the digital output signal is valid comprises one or more encryption techniques.

12. The system of claim 8, wherein the instruction to determine whether the digital output signal is valid further comprises an instruction to determine if the digital output signal includes a nonce followed by a known value.

13. The system of claim 8, wherein the instruction to enable an active RF receiver circuit for RF signal processing comprises an instruction to use one or more active signal modulation techniques.

14. The system of claim 8, wherein the instruction to enable an active RF receiver circuit for RF signal processing further comprises an instruction to execute a process in accordance with a signal received by the active RF receiver circuit.

15. An apparatus for reception of RF communications comprising:
a passive RF receiver circuit for receiving an AM signal;
a comparator for converting the AM signal to a digital output signal;
a first digital signal processing circuit for determining whether the digital output signal is valid based on a determination of whether the digital output signal includes a nonce followed by a known value; and
a switch for activating an active RF receiver circuit for RF signal processing upon detection of a valid digital output signal.

16. The apparatus of claim 15, wherein the passive RF receiver circuit comprises an antenna, a notch filter, and an AM demodulator.

17. The apparatus of claim 15, wherein the comparator is AC coupled to the passive RF receiver circuit.

18. The apparatus of claim 15, wherein the digital signal processing circuit determines whether the digital output signal is valid or not is based at least in part on determining whether the digital output signal includes a nonce followed by a known value.

19. The apparatus of claim 15, wherein the active RF receiver circuit comprises an active RF receiver and a second signal processor, the first signal processor consuming low power relative to the power consumption of the second signal processor.

20. The apparatus of claim 15, wherein the active RF receiver circuit comprises an RF notch filter.

* * * * *